United States Patent
Iwayama et al.

(10) Patent No.: US 8,168,459 B2
(45) Date of Patent: May 1, 2012

(54) METHOD FOR MANUFACTURING SEMICONDUCTOR LIGHT-EMITTING DEVICE

(75) Inventors: Sho Iwayama, Tokyo (JP); Takanobu Akagi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/009,071

(22) Filed: Jan. 19, 2011

(65) Prior Publication Data
US 2011/0177633 A1    Jul. 21, 2011

(30) Foreign Application Priority Data

Jan. 21, 2010   (JP) .................. 2010-011031

(51) Int. Cl.
*H01L 33/00* (2010.01)
(52) U.S. Cl. .................. 438/39; 257/E33.006
(58) Field of Classification Search .......... 438/26, 438/33, 39, 40, 42, 43, 458; 257/E33.006, 257/E33.057
See application file for complete search history.

(56) References Cited

U.S. PATENT DOCUMENTS
2007/0141807 A1* 6/2007 Ando et al. .......... 438/459

FOREIGN PATENT DOCUMENTS
JP  2002-261032 A   9/2002
JP  2003-303994 A   10/2003

* cited by examiner

*Primary Examiner* — William D Coleman
*Assistant Examiner* — Daniel Shook
(74) *Attorney, Agent, or Firm* — Holtz, Holtz, Goodman & Chick, PC

(57) ABSTRACT

A method for manufacturing a resin-embedded semiconductor light-emitting device that is capable of preventing a semiconductor film from being damaged when a growth substrate is delaminated using a laser lift-off method, and that is capable of preventing foreign matter from adhering to the semiconductor film when a resin material is applied. A laser exposure step to delaminate the growth substrate from the semiconductor film comprises a first laser exposure step for performing laser exposure at an energy density at which the resin is broken down but the semiconductor film is not broken down, in a range including a portion adjacent to at least one section of the semiconductor film divided by dividing grooves and at least one section of resin, and a second exposure step for performing laser exposure at an energy density at which the semiconductor film can be broken down in a range including at least one section.

19 Claims, 9 Drawing Sheets

2-STAGE LLO

1-STAGE LLO

2-STAGE LLO

1-STAGE LLO

METHOD FOR MANUFACTURING SEMICONDUCTOR LIGHT-EMITTING DEVICE

BACKGROUND OF THE INVENTION

1. Field of the Invention

The present invention relates to a semiconductor light-emitting device such as a light-emitting diode (LED), and more particularly to a method for manufacturing a semiconductor light-emitting device including a step in which the growth substrate used for crystal growth of the semiconductor film is removed using a laser lift-off method.

2. Description of the Related Art

Recent advances in technology have increased the efficiency and output of light-emitting elements such as light-emitting diodes (LEDs). However, the amount of heat generated by these light-emitting elements has risen along with output, and this heat has made them less reliable. In order to solve this problem, the growth substrate, which has relatively low thermal conductivity, has been removed, and replaced by a metal with relatively high thermal conductivity to support the semiconductor film. In addition to improving the heat radiating properties of the light-emitting element, the removal of the growth substrate in this configuration can be expected to improve light emission efficiency and the light extraction efficiency in particular. In other words, the light absorption that occurs when light passes through the growth substrate, and the light components completely reflected at the interface between the semiconductor film and the growth substrate due to the difference in refractive indices can be reduced. When a growth substrate of GaN-based semiconductor film is delaminated, the laser lift-off (LLO) method is most commonly used.

A technique is described in Japanese Patent Kokai No. 2003-303994 (Patent Literature 1) in which carbon-based foreign matter caused by the resin material near the semiconductor film adheres to the peeling surface of the semiconductor film during laser lift-off, and the foreign matter is removed by the laser.

The following procedure is disclosed in Japanese Patent Kokai No. 2002-261032 (Patent Literature 2) as a method for removing the growth substrate without using the laser lift-off method. A periodically stripe-shaped or island-shaped sacrificial film is formed on the surface of a sapphire substrate. A first nitride semiconductor is grown in the lateral direction from the exposed portion of the sapphire substrate, and growth is stopped by the lack of sacrificial film cover. The sacrificial film is then removed using etching to form a space in the lower portion of the first nitride semiconductor. A second nitride semiconductor is grown on the upper surface of the first nitride semiconductor and the side surfaces or the growth portion extending in the lateral direction. This forms space inside the nitride semiconductors, and the nitride semiconductors are supported by a column-shaped structure on top of the sapphire substrate. Because the joining strength between the nitride semiconductors and the sapphire substrate has been reduced, the sapphire substrate can be removed by vibrations or a thermal shock.

When a Cu film, for example, is formed on the surface of the semiconductor film as a support substrate, lattice-shaped element-dividing grooves (streets) are formed along the element dividing lines demarcating the first section of the semiconductor light-emitting device on the semiconductor film, and the surface of the semiconductor film is smoothed by the embedding of resin in these element-dividing grooves. The Cu film is formed on top of the smoothed semiconductor film using electroplating or another technique. Afterwards, the growth substrate is removed using the laser lift-off method. In such a resin-embedded semiconductor light-emitting device, the following problem occurs when the growth substrate is delaminated using the laser lift-off method. In the laser lift-off method, a laser is directed at the growth substrate from the rear surface, and the GaN-based semiconductor film formed on top of the growth substrate breaks down into metallic Ga and $N_2$ gas. It is difficult to discharge the N2 gas at this time, and so it collects near the interface between the semiconductor film and the growth substrate. The impact from the $N_2$ gas pressure sometimes causes the semiconductor film to crack. Exposure to the laser beam causes simultaneous breakdown and evaporation of both the semiconductor film and the resin, and some of the resin is likely to remain in the portions adjacent to the semiconductor film. When the growth substrate is delaminated with resin remaining on the perimeter of the semiconductor film, the edges and corners of the semiconductor film sometimes becomes cracked. Also, because exposure to the laser beam causes simultaneous breakdown and evaporation of both the semiconductor film and the resin, carbon-based materials generated by the resin material due to laser exposure is introduced below the surface of the semiconductor film exposed by the peeling off of the growth substrate, and the carbon-based foreign matter adheres to the exposed surface of the semiconductor film. Afterward, when electrodes and other elements are formed on the exposed surface of the semiconductor film and processing is performed to improve the light extraction efficiency, the steps described in Patent Literature 1 are required to remove the carbon-based foreign matter adhering to the surface of the semiconductor film.

In the technique described in Patent Literature 2, the growth substrate can be delaminated from the semiconductor film without using the laser lift-off method. However, crystal growth of the semiconductor substrate is a complicated process performed in two stages with a sacrificial film etching stage interposed between them. Also, when etching is used as the method for removing the sacrificial film, damage sometimes occurs to the electrodes and insulating film formed on the surface of the semiconductor film.

SUMMARY OF THE INVENTION

In view of the foregoing circumstances, it is an object of the present invention to provide a method for a manufacturing resin-embedded semiconductor light-emitting device that is able to prevent damage to the semiconductor film when the growth substrate is delaminated using the laser lift-off method, and that is able to prevent adhesion of foreign matter to the semiconductor film accompanying the application of a resin material.

The present invention is a method for manufacturing a semiconductor light-emitting device comprising: a step for forming a semiconductor film on top of a growth substrate; a step for etching the semiconductor film along element dividing lines to form dividing grooves in the semiconductor film reaching the growth substrate and dividing the semiconductor film; a step for filling the dividing grooves with a resin having laser absorbing properties; a step for forming on top of the semiconductor film a support member for supporting the semiconductor film; and a step for directing a laser at the growth substrate from a rear surface, breaking down the semiconductor film and the resin near an interface with the growth substrate, and delaminating the growth substrate from the semiconductor film, wherein the laser directing step further comprises a first laser exposure step for performing laser exposure at an energy density at which the resin is broken down but the semiconductor film is not broken down, in a range including a portion adjacent to at least one section of the semiconductor film divided by the dividing grooves and the at least one section of the resin, and a second exposure step for performing laser exposure at an energy density at which the semiconductor film can be broken down in a range including the at least one section.

According to the method for manufacturing a semiconductor light-emitting device of the present invention, the breakdown of the resin near the semiconductor film in the first laser exposure step forms a space on the perimeter of the semiconductor film. As a result, the $N_2$ gas generated by the semiconductor film in the second laser exposure step can be released via the space. Because $N_2$ gas is not retained on the semiconductor film and high pressure does not occur, cracking of the semiconductor film is avoided. Because the laser exposure in two stages reliably removes the resin on the perimeter of the semiconductor film, cracking does not occur in the edges and corners of the semiconductor film when the sapphire substrate is delaminated. Because exposure of the resin to the laser is suppressed as much as possible in the second laser exposure step, carbon-based foreign matter is prevented from adhering to the exposed surface of the semiconductor film.

DETAILED DESCRIPTION OF THE INVENTION

Figure 1:
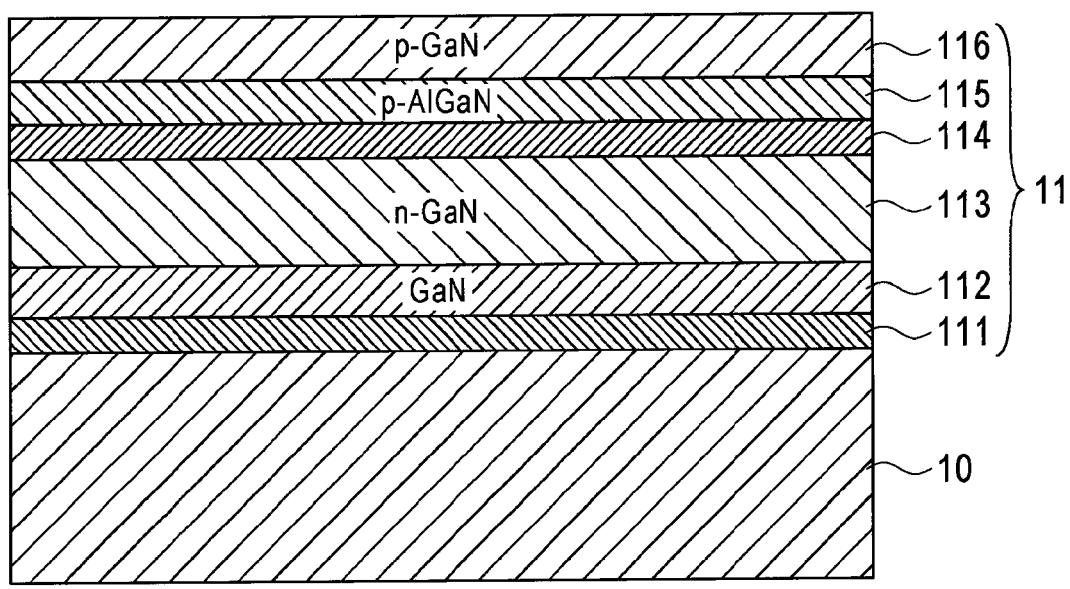
FIG. 1 is a cross-sectional view showing the layer structure of the semiconductor film according to an embodiment of the present invention.

The following is a description of embodiments of the present invention made with reference to the accompanying drawings. In the drawings indicated below, structural elements and portions substantially identical or equivalent are denoted by the same reference numerals. In the following explanation, the present invention is applied to the manufacture of an LED containing an AlxInyGazN semiconductor film ($0 \leq x \leq 1$, $0 \leq x \leq 1$, $x+y+z=1$).

(1st Embodiment)

FIG. 1 is a cross-sectional view representing the layer structure of the semiconductor film 11 according to an embodiment of the present invention. FIGS. 2A through 2E and FIG. 3A through FIG. 3D are cross-sectional views representing the method for manufacturing a semiconductor light-emitting device according to the first embodiment of the present invention. The semiconductor light-emitting device of the first embodiment has a configuration in which the semiconductor film whose crystals were grown epitaxially on top of the growth substrate is supported by Cu film formed using the electroplating method.

(Semiconductor Film Forming Step)

A sapphire substrate 10 is prepared as the growth substrate for the semiconductor film. The sapphire substrate 10 is heated for ten minutes at 1000° C. in a hydrogen atmosphere, and thermally cleaned. A semiconductor film 11 comprising a low temperature buffer layer 111, an underlying GaN layer 112, an n-GaN layer 113, an active layer 114, a p-AlGaN clad layer 115, and a p-GaN layer 116 is then formed on top of the sapphire substrate 10 using metal organic chemical vapor deposition (MOCVD). More specifically, trimethyl gallium (TMG; flow rate: 10.4 µmol/min) and $NH_3$ (flow rate: 3.3 LM) are supplied for approximately three minutes at a substrate temperature of 500° C. to form a low temperature buffer layer 111 on top of the sapphire substrate 10. Afterwards, the substrate temperature is raised to 1000° C. and held for approximately 30 seconds to allow the low temperature buffer layer 111 to crystallize. Next, the substrate temperature is maintained at 1000° C. while TMG (flow rate: 45 µmol/min) and $NH_3$ (flow rate: 4.4 LM) are supplied for approximately 20 minutes to form an approximately 1 µm-thick underlying GaN layer 112. Next, TMG (flow rate: 45 µmol/min), $NH_3$ (flow rate: 4.4 LM) and $SiH_4$ dopant gas (flow rate: $2.7 \times 10^{-9}$ mol/min) are supplied for approximately 100 minutes at a substrate temperature of 1000° C. to form a 5-µm-thick n-GaN layer 113. Next, an active layer 114 is formed on top of the n-GaN layer 113. In this embodiment, the active layer 114 is a multiple quantum well structure composed of InGaN/GaN. In other words, five cycles of growth is performed in which the InGaN/GaN is a single cycle. More specifically, the substrate temperature is set at 700° C., TMG (flow rate: 3.6 µmol/min), trimethyl indium (TMI; flow rate: 10 µmol/min), and $NH_3$ (flow rate: 4.4 LM) are supplied for approximately 33 seconds; and an approximately 2.2-nm-thick InGaN well layer is formed. Next, TMG (flow rate: 3.6 µmol/min) and $NH_3$ (flow rate: 4.4 LM) are supplied for approximately 320 seconds to form an approximately 15-nm-thick GaN barrier layer. This process is repeated for five cycles to form the active layer 114. Next, the substrate temperature is raised to 870° C., and TMG (flow rate: 8.1 µmol/min), trimethyl aluminum (TMA; flow rate: 7.5 µmol/min), $NH_3$ (flow rate: 4.4

Figure 2A:
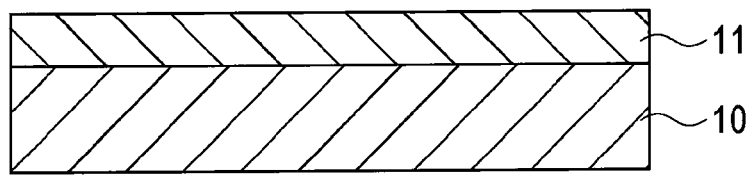
FIG. 2A through FIG. 2E are cross-sectional views showing the method for manufacturing a semiconductor light-emitting device according to the first embodiment of the present invention.

LM), and bis-cyclopentadienyl Mg (Cp$_2$Mg) dopant gas (flow rate: 2.9×10$^{-7}$ mol/min) are supplied for approximately five minutes to form a 40-nm-thick p-AlGaN clad layer 115. Next, without changing the substrate temperature, TMG (flow rate: 18 μmol/min), NH$_3$ (flow rate: 4.4 LM), and Cp$_2$Mg dopant gas (flow rate: 2.9×10$^{-7}$ mol/min) are supplied for approximately seven minutes to form an approximately 150-nm-thick p-GaN layer 116. A semiconductor film 11 composed of these layers is formed on top of the sapphire substrate 10 (FIG. 2A).

(Element Dividing Groove Forming Step)

Figure 2B:
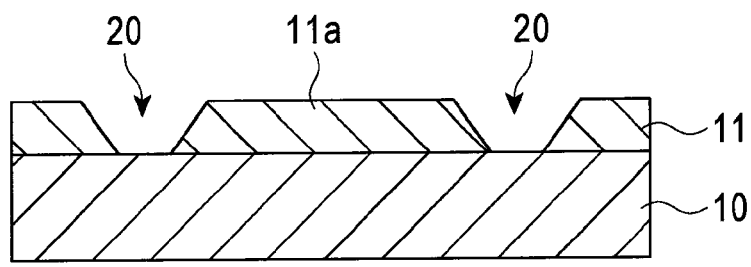

Next, element-dividing grooves 20 are formed to demarcate the individual semiconductor light-emitting devices in the semiconductor film 11. More specifically, after applying a resist material to the surface of the semiconductor film 11, a resist mask with a lattice pattern corresponding to the element-dividing grooves to be formed in the exposure and development process is formed (not shown). Next, the wafer is placed in a reactive-ion etching (RIE) device, and the semiconductor film 11 exposed in the openings of the resist mask is etched using dry etching with Cl$_2$ plasma. Lattice-like element-dividing grooves 20 are then formed in the semiconductor film 11 that reach the sapphire substrate 10. For example, element-dividing grooves 20 are used to divide the semiconductor film 11 into 1000 μm sections (chips) on one side (FIG. 2B).

(Protective Film Forming and Electrode Forming Step)

Next, a protective film 12 made of, for example, SiO$_2$ is formed on the side surface of the sections 11a of semiconductor film exposed by the formation of the element-dividing grooves 20. The protective film 12 prevents foreign matter from adhering to the exposed surface of the semiconductor film 11, and prevents the occurrence of leaks and shorts. The protective film 12 is formed by depositing SiO$_2$ film on top of the semiconductor film 11 using, for example, CVD and sputtering methods, and the film is patterned using the etching or lift-off method.

Figure 2C:
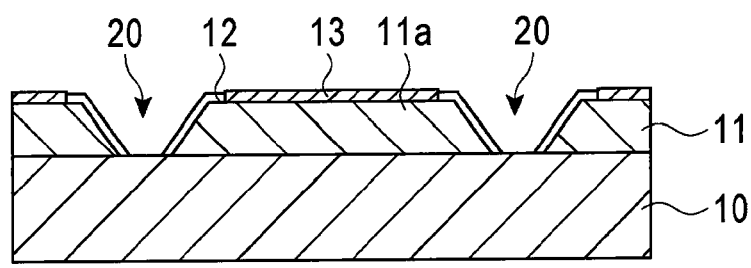

Next, the p electrode 13 is formed on the surface of the various sections 11a of the semiconductor film. A resist mask corresponding to the pattern of the p electrode 13 is formed on the surface of the various sections 11a of the semiconductor film, and PT (1 nm)/Ag (150 nm)/Ti (100 nm)/Au (200 nm) are deposited in the stated order using electron beam deposition. Afterwards, the metal film deposited on top of the resist mask is lifted off to form the p electrodes 13 (FIG. 2C).

(Resin Embedding Step)

Figure 2D:
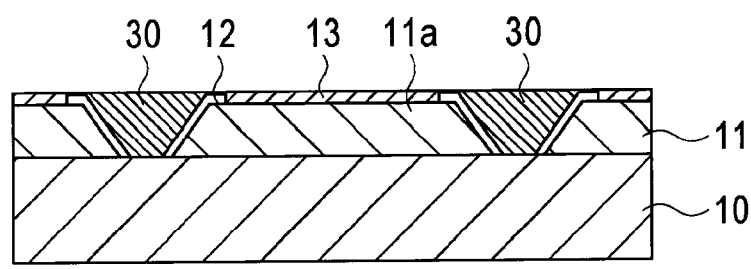

Next, the element-dividing grooves 20 formed in the semiconductor film 11 are filled with resin 30 having laser-absorbing properties. The resin 30 can be a resist material containing a novolac resin. The resist material is uniformly applied on top of the wafer by spin-coating, and the element-dividing grooves 20 are filled with resist material. Afterwards, a heat treatment is performed at 150° C. to remove the solution and water contained in the resist material, and to cure the resist material. Afterwards, the surface of the resin 30 embedded in the element-dividing grooves 20 and the surface of the p electrode 13 are leveled (FIG. 2D). In addition to a resist material, the resin 30 can be a polyimide, an epoxy resin, or a silicone resin.

(Support Substrate Forming Step)

Figure 2E:
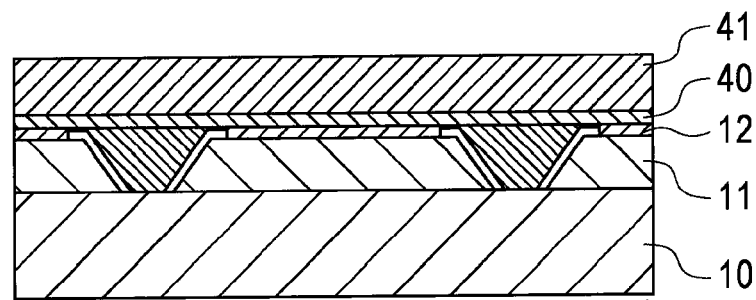

Next, Cu film 41 functioning as a support substrate is formed on top of the semiconductor film 11. More specifically, a plated sheet film 40 of Cu is formed on the exposed surface structure of the p electrodes 13 and the resin 30 using sputtering. Afterwards, the wafer is immersed in a copper cyanide or copper sulfate base plating bath, and Cu film 41 is grown on top of the plated sheet layer 40 using electroplating to form the support substrate (FIG. 2E).

(Growth Substrate Delamination Step)

Figure 3A:
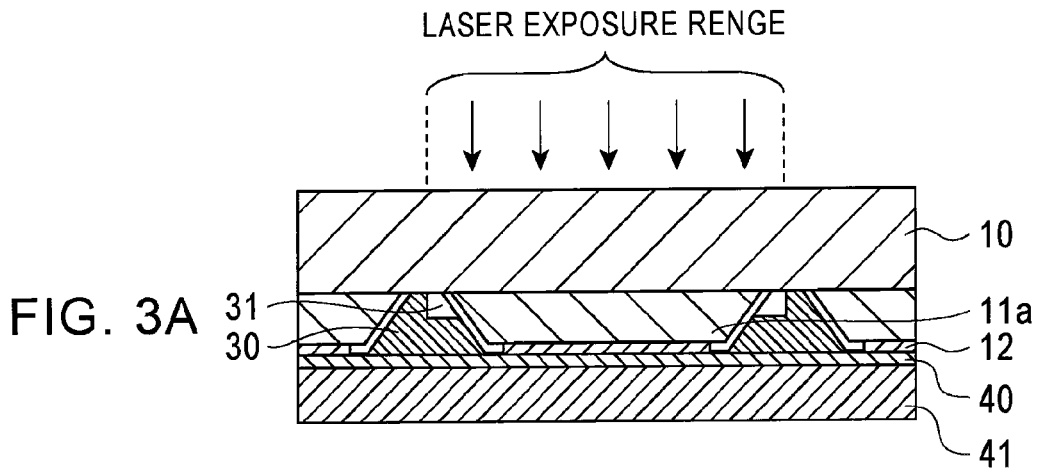
FIG. 3A through FIG. 3D are cross-sectional views showing the method for manufacturing a semiconductor light-emitting device according to the first embodiment of the present invention.
Figure 3B:
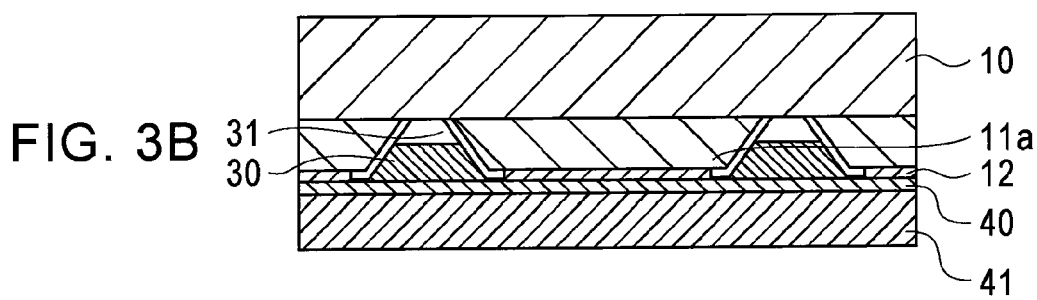

Next, the sapphire substrate 10 is delaminated using the laser lift-off method. The sapphire substrate 10 is delaminated by changing the energy density of the laser and performing two-stage laser exposure. In these stages, the laser light source is a KrF excimer laser with a wavelength of 248 nm. The excimer laser has transparency with respect to sapphire 10, but is absorbed by the GaN constituting the semiconductor film 11. Therefore, in this embodiment, some of the low temperature buffer layer 111 or underlying GaN layer 112 breaks down into Ga and N$_2$ gas near the interface with the sapphire substrate 10. The laser exposure is performed by section 11a (chip) demarcated by the element-dividing grooves 20. In the first stage of the laser exposure process (first laser exposure step), only the resin 30 filling the element-dividing grooves 20 is broken down from the rear surface side of the sapphire substrate 10. The laser exposure is performed at a relatively low energy density (e.g., 200 mJ/cm$^2$) that does not cause the semiconductor film 11 to break down. The one-shot exposure range is indicated by the dotted lines 100 in FIG. 4. In other words, the dotted lines 100 indicate the beam spot in the first laser exposure step. In the first laser exposure step, one shot of laser exposure occurs in a range including one section 11a of the semiconductor film and some of the resin 30 surrounding the section 11a. The exposure range can extend to the center position in the width direction of the element-dividing grooves 20. More specifically, the beam spot 100 is larger than the size of one section 11a of the semiconductor film, which is 1000 μm on one side. It can form a square, which is, for example, 1120 μm on one side. The center of the beam spot is aligned with the center of the section 11a of the semiconductor film, and laser exposure is performed. By performing laser exposure under these conditions, the resin 30 in the portion surrounding the section 11a of the semiconductor film is broken down and evaporated, and a space 31 is formed on the outer periphery of the section 11a (FIG. 3A). The beam spot 100 performs successive scans, and each section 11a is exposed to the laser. The entire region of the wafer is thus exposed to the laser. FIG. 3B shows the situation after the first laser exposure step has been completed. In the first laser exposure step, the energy density of the laser is held down. In this stage, some of the low temperature buffer layer 111 or underlying GaN layer 112 does not break down, and the sapphire substrate 10 and the semiconductor laser 11 remain joined. As a result, carbon-based material generated by the break down and evaporation of the resin 30 does not adhere to the semiconductor film 11.

Figure 3C:
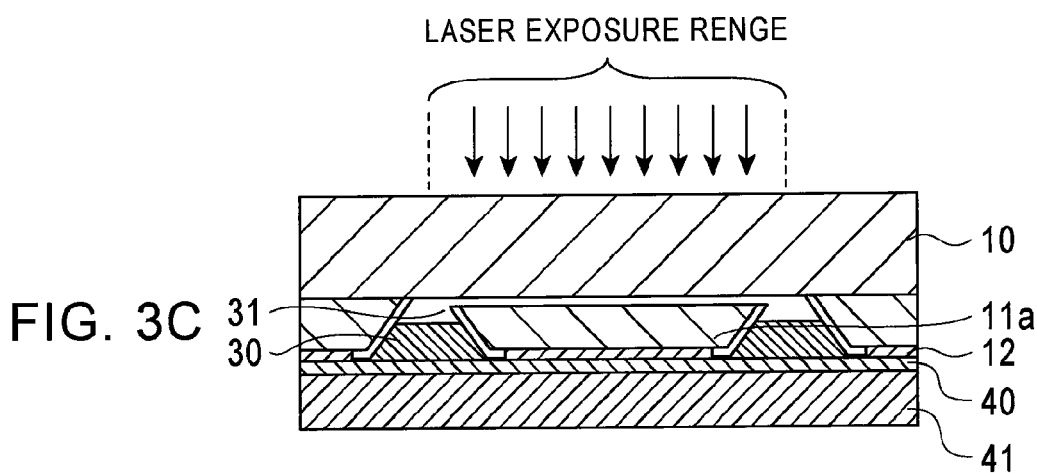
Figure 4:
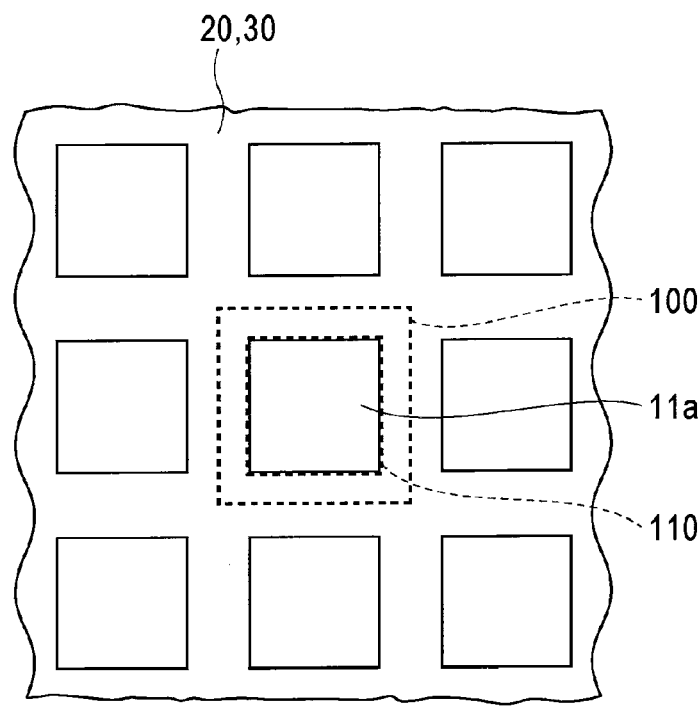
FIG. 4 is a diagram showing the laser exposure ranges in the growth substrate peeling step according to an embodiment of the present invention.

In the second stage (second laser exposure step) of the laser exposure process, the laser exposure is performed at a relatively high energy density (e.g., 850 mJ/cm$^2$) able to break down some of the low temperature buffer layer 111 or the underlying GaN layer 112 from the rear surface side of the sapphire substrate 10. The one-shot exposure range is indicated by the dotted lines 110 in FIG. 4. In other words, the dotted lines 110 indicate the beam spot in the second laser exposure step. As shown in FIG. 4, the exposure range for the beam in the second laser exposure step is narrower than the exposure range in the first laser exposure step. In the second laser exposure step, the laser exposure preferably includes at least one section 11a of the semiconductor film, but to the extent possible does not include the resin 30 in the portion surrounding the section 11a of the semiconductor film. More specifically, the beam spot 110 is slightly larger than the size of the section 11a of the semiconductor film, which is 1000 μm on one side. It can form a square, which is, for example, 1040 μm on one side. The center of the beam spot is aligned with the center of the section 11a of the semiconductor film, and laser exposure is performed. By performing laser exposure under these conditions, some of the low temperature buffer layer 111 or underlying GaN layer 112 breaks down into Ga and $N_2$ gas near the interface with the sapphire substrate 10, and the sapphire substrate 10 is peeled from the semiconductor film 11 in the laser exposed portion (FIG. 3C). The laser beam can be easily shaped using a metal mask.

The space 31 formed on the outer periphery of the sections 11a by the laser exposure in the first laser exposure step functions as the release route for the $N_2$ gas generated by the semiconductor film 11 by the laser exposure in the second laser exposure step. In other words, the generated $N_2$ gas is not retained underneath the semiconductor film but is released to the outside via the space 31. This relieves the pressure of the $N_2$ gas acting on the semiconductor film 11, and prevents cracks from occurring. The resin 30 is exposed to a portion of the laser in the second laser exposure step, but the beam spot 110 is as small as possible, as described above, so the amount of carbon-based material generated is suppressed, and the amount of carbon-based foreign matter adhering to the exposed surface of the semiconductor film 11 can be greatly reduced. When the $N_2$ gas is released via the space 31 formed on the outer periphery of the semiconductor film 11, a gas flow is generated in the direction of the outer periphery on the main surface of the various sections 11a. As a result, the carbon-based material generated by the resin 30 is not introduced underneath the semiconductor film 11. This suppresses even further the adherence of foreign matter to the exposed surface of the semiconductor film 11.

Figure 3D:
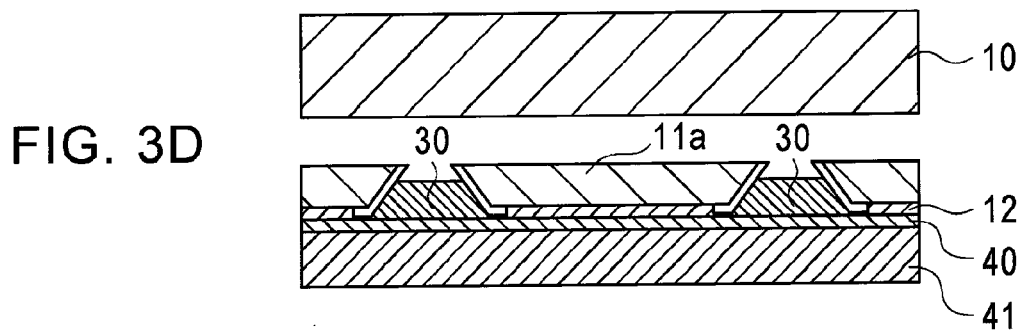

The beam spot 100 performs successive scans, and each section 11a is exposed to the laser. The entire region of the wafer is thus exposed to the laser, and the sapphire substrate 10 is completely delaminated from the semiconductor film 11 (FIG. 3D). In this embodiment, the laser light source is a KrF excimer laser. However, an ArF excimer laser with a wavelength of 193 nm, and a Nd:YAG laser with a wavelength of 266 nm can be used.

Afterwards, n electrodes (not shown) are formed on the surface of the sections 11a exposed when the sapphire substrate 10 is delaminated. The laser scribing method is used to scribe the Cu film 41 serving as the support substrate along the element-dividing grooves 20 and separate the chips. The semiconductor light-emitting devices are completed by performing these steps.

Figure 5A:
FIG. 5A is a diagram showing the surface of the semiconductor film when the growth substrate is delaminated using the two-stage laser exposure technique of the present invention.
Figure 5B:
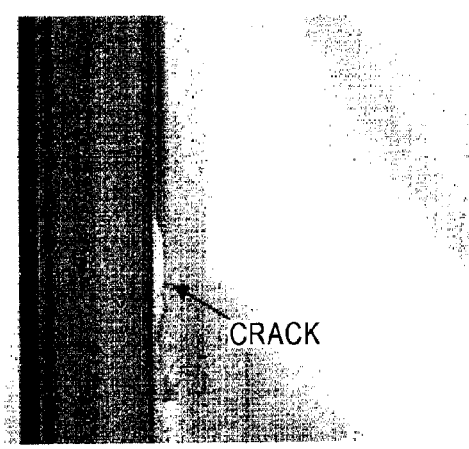
FIG. 5B is a diagram showing the surface of the semiconductor film when the growth substrate is delaminated using the one-stage laser exposure technique of the prior art.
Figure 6A:
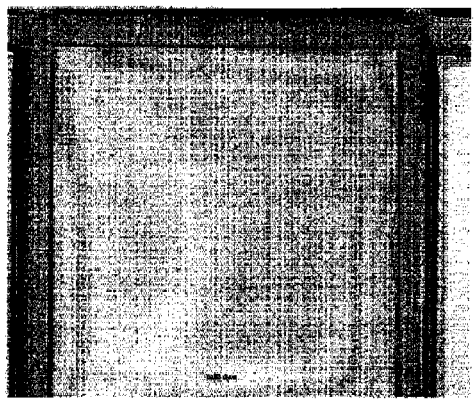
FIG. 6A is a diagram showing the surface of the semiconductor film when the growth substrate is delaminated using the two-stage laser exposure technique of the present invention.
Figure 6B:
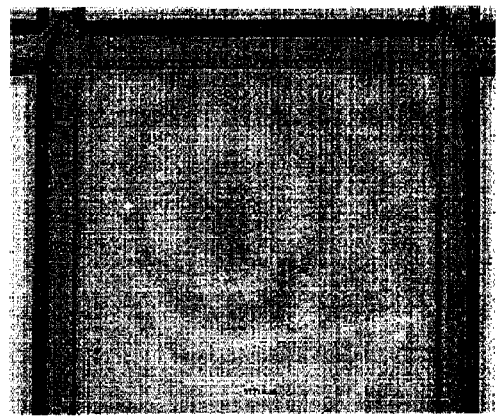
FIG. 6B is a diagram showing the surface of the semiconductor film when the growth substrate is delaminated using the one-stage laser exposure technique of the prior art.

FIG. 5A and FIG. 6A are metal micrographs of the exposed surface of the semiconductor film after the sapphire substrate has been delaminated using the two-stage laser exposure technique of this embodiment. FIG. 5B and FIG. 6B are comparative examples showing the exposed surface of the semiconductor film after the sapphire substrate has been delaminated using the one-stage laser exposure technique of the prior art. More specifically, a beam spot is formed with a square shape that is 1120 μm on one side for a section of the semiconductor film demarcated by element-dividing grooves that are 1000 μm on one side, and one-stage laser exposure is performed at an energy density of 850 mJ/cm², which is able to break down the semiconductor film, in order to delaminate the sapphire substrate. As shown in FIG. 5A and FIG. 6A, when the sapphire substrate is delaminated using two-stage laser exposure, no cracking of the edges and corners of the semiconductor film 11 is observed, and hardly any foreign matter adheres to the exposed surface of the semiconductor film 11. As shown in FIG. 5B, cracking is observed on the edges of the semiconductor film 11 when the sapphire substrate is delaminated all at once using one-stage laser exposure. As shown in FIG. 6B, carbon-based foreign matter adheres to the exposed surface of the semiconductor film 11.

In the method for manufacturing a semiconductor light-emitting device in this embodiment, laser exposure is performed in the first laser exposure step at a relatively low energy density, which breaks down the resin 30 filling the element-dividing grooves 20 but does not break down the GaN layer in the semiconductor film 11, and laser exposure is performed in the second laser exposure step at a relatively high energy density, which breaks down the GaN layer. Because the $N_2$ gas generated by the semiconductor film 11 during the laser exposure in the second laser exposure step can be released via the space 31 formed on the periphery of the semiconductor film 11 in the first laser exposure step, $N_2$ gas is not retained underneath the semiconductor film 11 and pressure is not exerted. This avoids the occurrence of cracking in the semiconductor film 11. Because the resin surrounding the semiconductor film 11 is reliably removed by the two-stage laser exposure technique, cracks are not introduced to the edges and corners of the semiconductor film 11 when the semiconductor substrate 10 is delaminated. Also, by suppressing as much as possible exposure of the resin 30 to the laser in the second laser exposure step, adherence of carbon-based foreign matter to the exposed surface of the semiconductor film 11 can be prevented. Thus, treatment to eliminate carbon-based foreign matter, as described in Patent Literature 1, is not required. The manufacturing method of the present invention is not complicated, and does not conduct crystal growth of the semiconductor film 11 in two stages as in the manufacturing method described in Patent Literature 2. It also does not require processing such as the etching of sacrificial film. Thus, elements such as the electrodes and the protective film accompanying the semiconductor film 11 are not damaged.

(2nd Embodiment)

FIG. 7A through FIG. 7E and FIG. 8A through FIG. 8E are cross-sectional views showing the method for manufacturing a semiconductor light-emitting device according to the second embodiment of the present invention. In the semiconductor light-emitting device according to the second embodiment, the semiconductor film whose crystals were grown epitaxially on top of a growth substrate are supported by an Si substrate prepared separately.

Figure 7A:
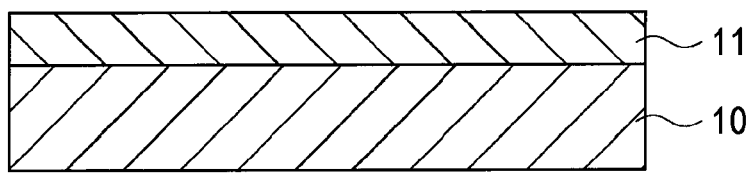
FIG. 7A through FIG. 7E are cross-sectional views of the method for manufacturing a semiconductor light-emitting device according to the second embodiment of the present invention.
Figure 7B:
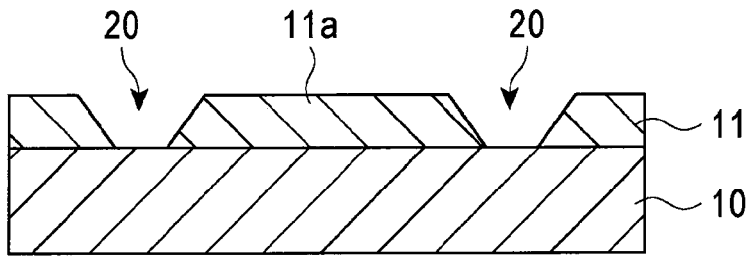
Figure 7C:
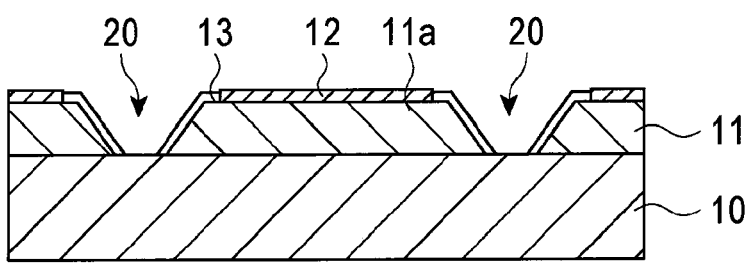

An AlxInyGazN semiconductor film 11 is formed on top of a sapphire substrate 10 by performing MOCVD on the surface of the sapphire substrate 10. The structure and growing conditions for the semiconductor film 11 are the same as those in the first embodiment (FIG. 7A). Next, element-dividing grooves 20 demarcating the various semiconductor light-emitting devices are formed in the semiconductor film 11. As in the first embodiment, these element-dividing grooves 20 are formed by performing dry etching using, for example, $Cl_2$ plasma. The semiconductor film 11 can thus be divided into sections (chips) 11a that are, for example, 1000 μm on one side (FIG. 7B). Next, protective film 12 of, for example, $SiO_2$ is formed using CVD or sputtering on the side surface of the sections 11a of semiconductor film exposed by the formation of the element-dividing grooves 20. Afterwards, Pt (1 nm)/Ag (150 nm)/Ti (100 nm)/Au (200 nm) are deposited successively using the electron beam vapor deposition method on the surface of the sections 11a of semiconductor film, and then patterned using the lift-off method to form p electrodes 13 (FIG. 7C).

Figure 7D:
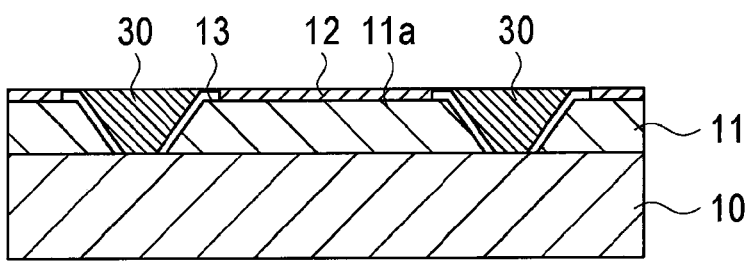

Next, the element-dividing grooves 20 formed in the semiconductor film 11 are filled with a resin 30 having laser absorbing properties. The resin 30 is preferably a material such as polyimide which can withstand the heat treatment performed when the semiconductor film is bonded to the support substrate as described below. More specifically, polyamic acid solution is used as a coating agent, and this is applied uniformly on top of the wafer by spin coating. The coating is then dried, and heat treatment is performed to imidize the dry coating. Afterwards, the surface of the resin 30 embedded in the element-dividing grooves 20 is leveled with the surface of the p electrodes 13 (FIG. 7D).

Figure 7E:
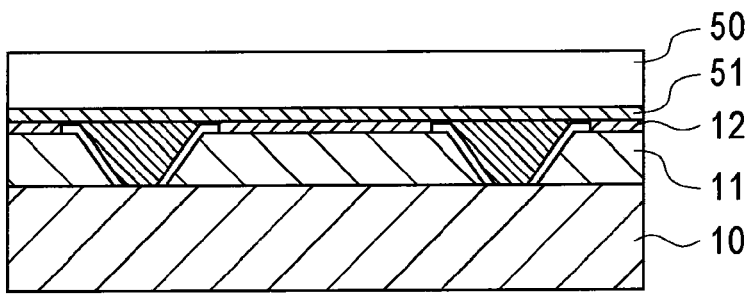

Next, a silicon substrate 50 composed of monocrystal silicon is prepared for use as the support substrate. Pt, Ti, Ni, Au, Pt, Au and Su are successively deposited on one of the surfaces of the silicon substrate 50 using vapor deposition, and a joining layer 51 containing a eutectic material is formed. Next, the semiconductor film 11 and the silicon substrate 50 are bonded together under heat and pressure in a nitrogen atmosphere with the joining layer 51 containing the eutectic material facing the p electrodes 13. The eutectic material in the joining layer 51 is melted and solidified to join the semiconductor layer 11 to the silicon substrate 50 (FIG. 7E). Next, the sapphire substrate 10 is delaminated using the laser lift-off method. As in the first embodiment, the energy density of the laser is changed to perform two-stage laser exposure, and the sapphire substrate 10 is delaminated. The laser light source can be an excimer laser with a wavelength of 248 nm. The laser exposure can be performed separately on each section 11a demarcated by the element-dividing grooves 20.

Figure 8A:
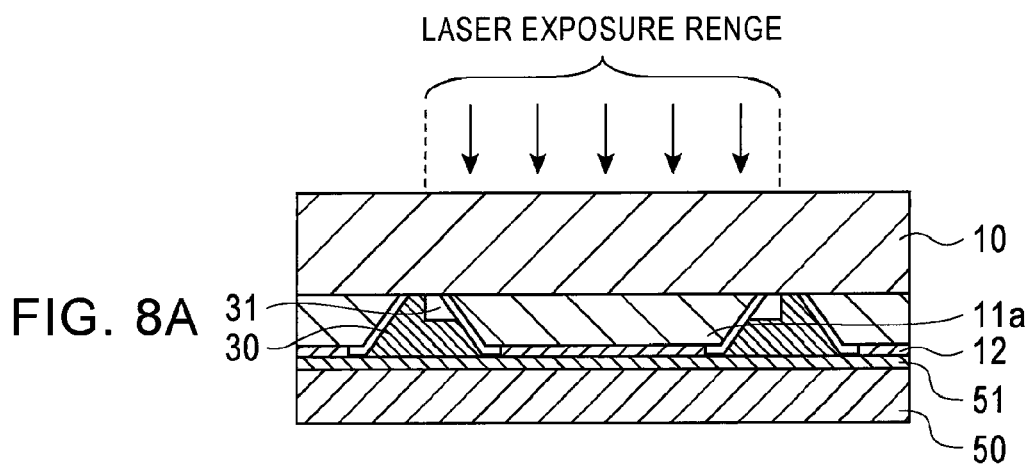
FIG. 8A through FIG. 8D are cross-sectional views of the method for manufacturing a semiconductor light-emitting device according to the second embodiment of the present invention.

In the first stage of the laser exposure process (first laser exposure step), only the resin 30 filling the element-dividing grooves 20 is broken down from the rear surface side of the sapphire substrate 10. The laser exposure is performed at a relatively low energy density (e.g., 200 mJ/cm$^2$) that does not cause the GaN layer in the semiconductor film 11 to break down. The one-shot exposure range is indicated by the dotted lines 100 in FIG. 4. In other words, the dotted lines 100 indicate the beam spot in the first laser exposure step. In the first laser exposure step, one shot of laser exposure occurs in a range including one section 11a of the semiconductor film and some of the resin 30 surrounding the section 11a. The exposure range can extend to the center position in the width direction of the element-dividing grooves 20. More specifically, the beam spot 100 is larger than the size of one section 11a of the semiconductor film, which is 1000 μm on one side. It can form a square, which is, for example, 1120 μm on one side. The center of the beam spot is aligned with the center of the section 11a of the semiconductor film, and laser exposure is performed. By performing laser exposure under these conditions, the resin 30 in the portion surrounding the section 11a of the semiconductor film is broken down and evaporated, and a space 31 is formed on the outer periphery of the section 11a (FIG. 8A).

Figure 8B:
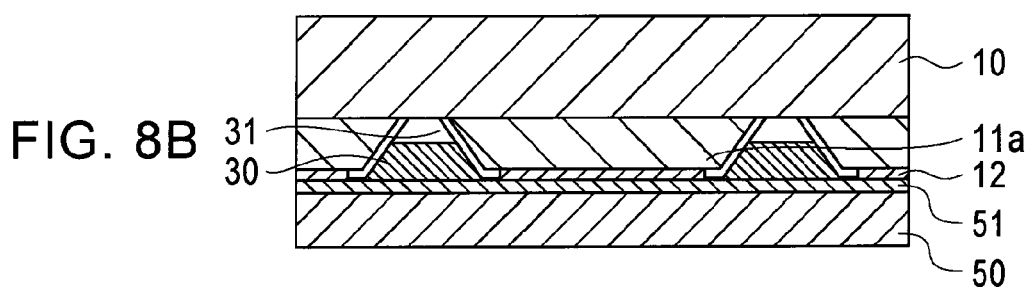

The beam spot 100 performs successive scans, and each section 11a is exposed to the laser. The entire region of the wafer is thus exposed to the laser. FIG. 8B shows the situation after the first laser exposure step has been completed. In the first laser exposure step, the energy density of the laser is held down. In this stage, some of the low temperature buffer layer 111 or underlying GaN layer 112 does not break down, and the sapphire substrate 10 and the semiconductor laser 11 remain joined. As a result, carbon-based material generated by the break down and evaporation of the resin 30 does not adhere to the semiconductor film 11.

Figure 8C:
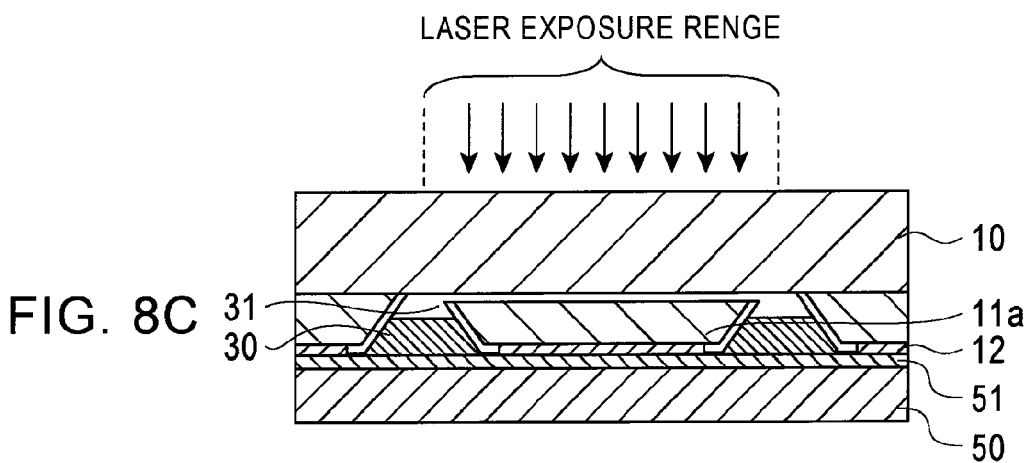

In the second stage (second laser exposure step) of the laser exposure process, the laser exposure is performed at a relatively high energy density (e.g., 850 mJ/cm$^2$) able to break down some of the low temperature buffer layer 111 or the underlying GaN layer 112 from the rear surface side of the sapphire substrate 10. The one-shot exposure range is indicated by the dotted lines 110 in FIG. 4. In other words, the dotted lines 110 indicate the beam spot in the second laser exposure step. As shown in FIG. 4, the exposure range for the beam in the second laser exposure step is narrower than the exposure range in the first laser exposure step. In the second laser exposure step, the laser exposure preferably includes at least one section 11a of the semiconductor film, but to the extent possible does not include the resin 30 in the portion surrounding the section 11a of the semiconductor film. More specifically, the beam spot 110 is slightly larger than the size of the section 11a of the semiconductor film, which is 1000 μm on one side. It can form a square that is, for example, 1040 μm on one side. The center of the beam spot is aligned with the center of the section 11a of the semiconductor film, and laser exposure is performed. By performing laser exposure under these conditions, some of the low temperature buffer layer 111 or underlying GaN layer 112 breaks down into Ga and N$_2$ gas near the interface with the sapphire substrate 10, and the sapphire substrate 10 is peeled from the semiconductor film 11 in the laser exposed portion (FIG. 8C). The laser beam can be easily shaped using a metal mask.

The space 31 formed on the outer periphery of the sections 11a by the laser exposure in the first laser exposure step functions as the release route for the N$_2$ gas generated by the semiconductor film 11 by the laser exposure in the second laser exposure step. In other words, the generated N$_2$ gas is not retained underneath the semiconductor film but is released to the outside via the space 31. This relieves the pressure of the N$_2$ gas acting on the semiconductor film 11, and prevents cracks from occurring. The resin 30 is exposed to a portion of the laser in the second laser exposure step, but since the beam spot 110 is as small as possible, as described above, the amount of carbon-based material generated is minimized, and the amount of carbon-based foreign matter adhering to the exposed surface of the semiconductor film 11 can be greatly reduced. When the N$_2$ gas is released via the space 31 formed on the outer periphery of the semiconductor film 11, a gas flow is generated in the direction of the outer periphery on the main surface of the various sections 11a. As a result, the carbon-based material generated by the resin 30 is not introduced underneath the semiconductor film 11. This minimizes even further the adherence of foreign matter to the exposed surface of the semiconductor film 11.

Figure 8D:
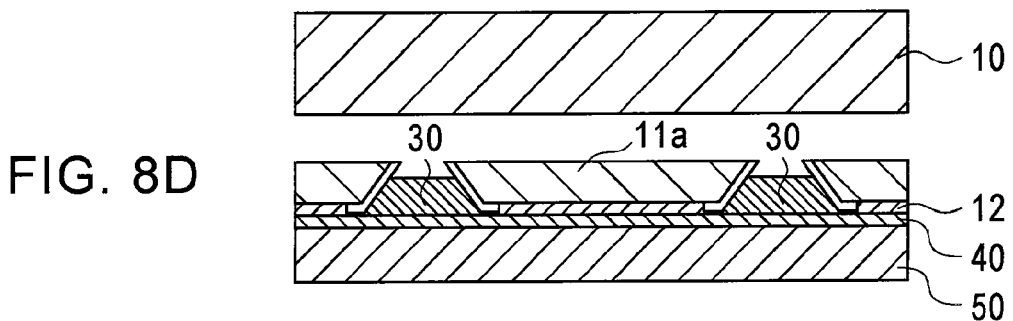

The beam spot 100 performs successive scans, and each section 11a is exposed to the laser. The entire region of the wafer is thus exposed to the laser, and the sapphire substrate 10 is completely delaminated from the semiconductor film 11 (FIG. 8D).

Afterwards, n electrodes (not shown) are formed on the surface of the sections 11a exposed when the sapphire substrate 10 is delaminated. The laser scribing method is used to scribe the silicon substrate 50 serving as the support substrate along the element-dividing grooves 20 and separate the chips. The semiconductor light-emitting devices are completed by performing these steps.

The manufacturing method of the present invention can thus be applied to a bonded semiconductor light-emitting device in which the silicon substrate joined to the semiconductor film functions as a support substrate. As in the first embodiment, adherence of foreign matter to and cracking of the semiconductor film can be prevented.

(3rd Embodiment)

Figure 9A:
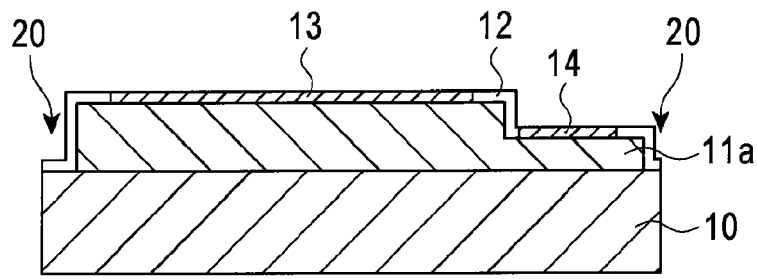
FIG. 9A through FIG. 9C are cross-sectional views of the method for manufacturing a semiconductor light-emitting device according to the third embodiment of the present invention.

FIG. 9A through FIG. 9E and FIG. 10A through FIG. 10B are cross-sectional views showing the method for manufacturing a semiconductor light-emitting device in the third embodiment of the present invention. In the semiconductor light-emitting device of the third embodiment, a semiconductor film 11 whose crystals were grown epitaxially on top of a growth substrate is a flip-chip connected to the top of a submount. The semiconductor film is formed on the surface of a sapphire substrate 10 using MOCVD. The structure and growing conditions of the semiconductor film are the same as those in the first embodiment. Afterwards, the n layer is exposed by etching the semiconductor film via a predetermined resist mask. Next, element-dividing grooves 20 are formed in the semiconductor film to demarcate the individual semiconductor light-emitting devices. The semiconductor film can then be divided into sections 11a which are 1000 µm on a side. Next, the p electrodes 13 and n electrodes 14 are formed using the vapor deposition method on the surface of the sections 11a of the semiconductor film, and a protective film 12 made of $SiO_2$ is formed on the side surfaces of the sections 11a using the CVD method and sputtering method (FIG. 9A).

Figure 9B:
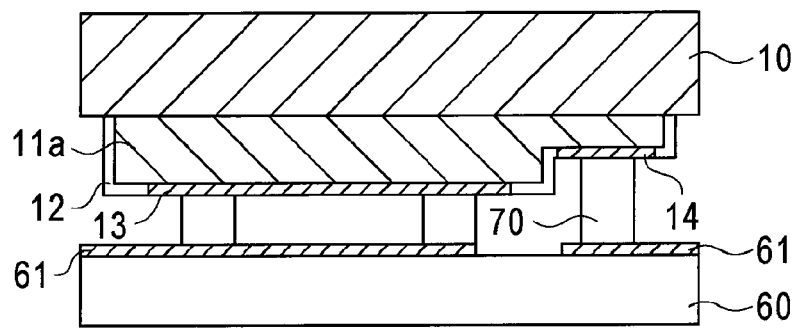

Next, a submount 60 composed of, for example, a ceramic such as aluminum nitride or aluminum oxide is prepared. Conductive wiring is formed on the surface of the submount 60 corresponding to the p electrodes 13 and n electrodes 14. The sections 11a of the semiconductor film are then flip-chip connected via metal bumps 70 to the submount 60 (FIG. 9B).

Figure 9C:
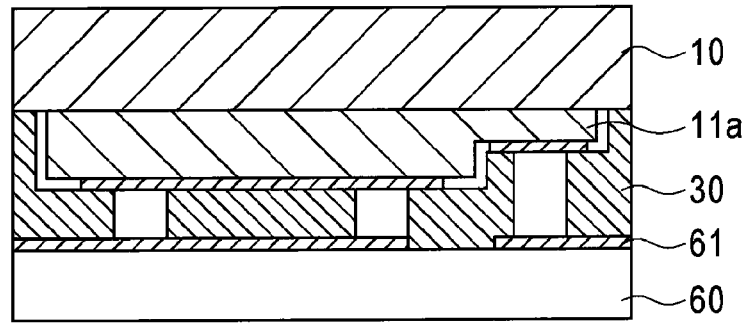

Next, the spaces between the sections 11a of the semiconductor film and the submount 60 and the element-dividing grooves 20 are filled with a resin 30 having laser absorbing properties. Filling these spaces with the resin 30 provides reliable insulating properties and moisture resistance, and can improve the reliability of the semiconductor light-emitting devices. The resin material can be a polyimide, silicone resin, or epoxy resin (FIG. 9C).

Next, the sapphire substrate 10 is delaminated using the laser lift-off method. As in the first embodiment, the sapphire substrate 10 is delaminated by changing the energy density of the laser and performing two-stage laser exposure. The laser light source can be an excimer laser with a wavelength of 248 nm. The laser exposure can be performed separately on each section 11a demarcated by the element-dividing grooves 20.

Figure 10A:
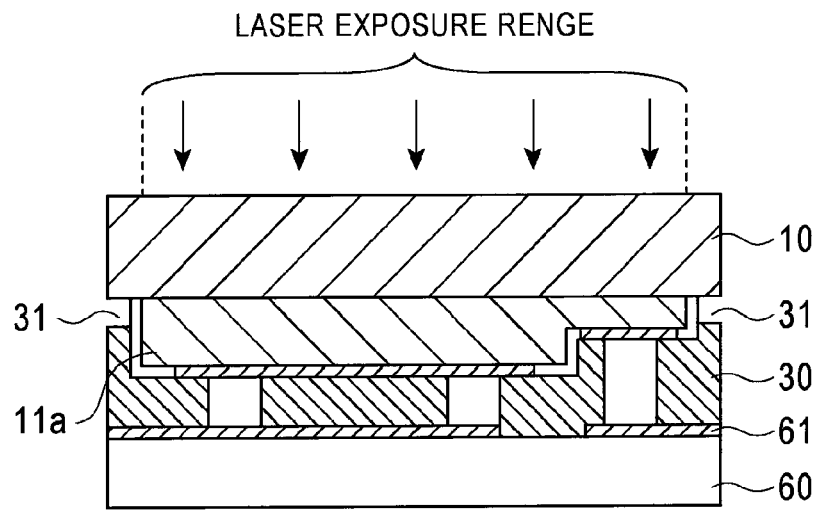
FIG. 10A and FIG. 10B are cross-sectional views of the method for manufacturing a semiconductor light-emitting device according to the third embodiment of the present invention.

In the first stage of the laser exposure process (first laser exposure step), only the resin 30 filling the element-dividing grooves 20 is broken down from the rear surface side of the sapphire substrate 10. The laser exposure is performed at a relatively low energy density (e.g., 200 $mJ/cm^2$) that does not cause the GaN layer in the semiconductor film 11 to break down. The one-shot exposure range is indicated by the dotted lines 100 in FIG. 4. In other words, the dotted lines 100 indicate the beam spot in the first laser exposure step. In the first laser exposure step, one shot of laser exposure occurs in a range including one section 11a of the semiconductor film and some of the resin 30 surrounding the section 11a. The exposure range can extend to the center position in the width direction of the element-dividing grooves 20. More specifically, the beam spot 100 is larger than the size of one section 11a of the semiconductor film, which is 1000 µm on one side. It can form a square, which is, for example, 1120 µm on one side. The center of the beam spot is aligned with the center of the section 11a of the semiconductor film, and laser exposure is performed. By performing laser exposure under these conditions, the resin 30 in the portion surrounding the semiconductor film is broken down and evaporated, and a space 31 is formed on the outer periphery of the section 11a (FIG. 10A).

Figure 10B:
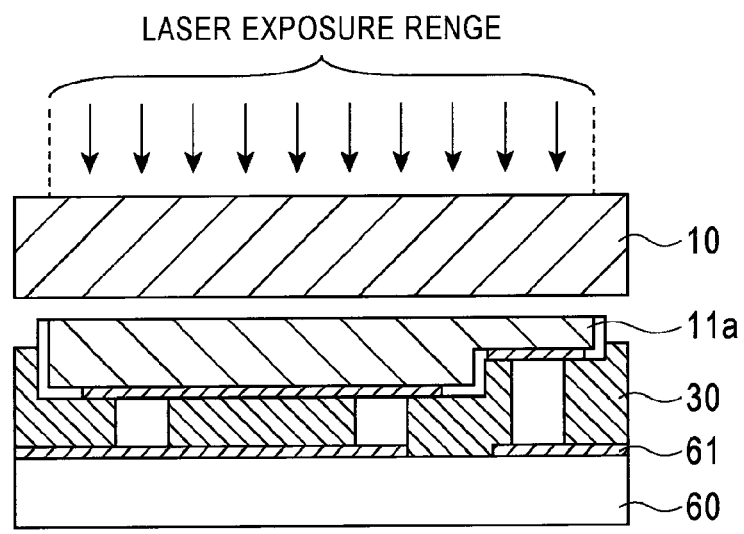

The beam spot 100 performs successive scans, and each section 11a is exposed to the laser. The entire region of the wafer is thus exposed to the laser. FIG. 10B shows the situation after the first laser exposure step has been completed. In the first laser exposure step, the energy density of the laser is held down. In this stage, some of the low temperature buffer layer 111 or underlying GaN layer 112 does not break down, and the sapphire substrate 10 and the semiconductor laser 11 remain joined. As a result, carbon-based material generated by the break down and evaporation of the resin 30 does not adhere to the semiconductor film 11.

In the second stage (second laser exposure step) of the laser exposure process, the laser exposure is performed at a relatively high energy density (e.g., 850 $mJ/cm^2$) able to break down some of the low temperature buffer layer 111 or the underlying GaN layer 112 from the rear surface side of the sapphire substrate 10. The one-shot exposure range is indicated by the dotted lines 110 in FIG. 4. In other words, the dotted lines 110 indicate the beam spot in the second laser exposure step. As shown in FIG. 4, the exposure range for the beam in the second laser exposure step is narrower than the exposure range in the first laser exposure step. In the second laser exposure step, the laser exposure preferably includes at least one section 11a of the semiconductor film, but to the extent possible does not include the resin 30 in the portion surrounding the section 11a of the semiconductor film. More specifically, the beam spot 110 is slightly larger than the size of the section 11a of the semiconductor film, which is 1000 µm on one side. It can form a square, which is, for example, 1040 µm on one side. The center of the beam spot is aligned with the center of the section 11a of the semiconductor film, and laser exposure is performed. By performing laser exposure under these conditions, some of the low temperature buffer layer 111 or underlying GaN layer 112 breaks down into Ga and $N_2$ gas near the interface with the sapphire substrate 10, and the sapphire substrate 10 is peeled from the semiconductor film 11 in the laser exposed portion (FIG. 10B). The laser beam can be easily shaped using a metal mask.

The space 31 formed on the outer periphery of the sections 11a by the laser exposure in the first laser exposure step functions as the release route for the $N_2$ gas generated by the semiconductor film 11 by the laser exposure in the second laser exposure step. In other words, the generated $N_2$ gas is not retained underneath the semiconductor film but is released to the outside via the space 31. This relieves the pressure of the $N_2$ gas acting on the semiconductor film 11, and prevents cracks from occurring. The resin 30 is exposed to a portion of the laser in the second laser exposure step, but the beam spot 110 is as small as possible, as described above, so the amount of carbon-based material generated is minimized, and the amount of carbon-based foreign matter adhering to the exposed surface of the semiconductor film 11 can be greatly reduced. When the $N_2$ gas is released via the space 31 formed on the outer periphery of the semiconductor film 11, a gas flow is generated in the direction of the outer periphery on the main surface of the various sections 11a. As a result, the carbon-based material generated by the resin 30 is not introduced underneath the semiconductor film 11. This suppresses even further the adherence of foreign matter to the exposed surface of the semiconductor film 11.

The beam spot 100 performs successive scans, and each section 11a is exposed to the laser. The entire region of the wafer is thus exposed to the laser, and the sapphire substrate 10 is completely delaminated of the semiconductor film 11.

Afterwards, the laser scribe method is used to dice the submount 60 along the element-dividing grooves 20 and separate the chips. The semiconductor light-emitting devices are completed by performing these steps.

The manufacturing method of the present invention can thus be applied to a semiconductor light-emitting device in which the semiconductor film is mounted on a submount. As in the first embodiment, adherence of foreign matter to and cracking of the semiconductor film can be prevented.

The structures of the semiconductor film 11 in the embodiments are for illustrative purposes only, and the present invention is by no means limited to these structures. The present invention can be applied broadly to GaN-based semiconductor light-emitting devices.

This application is based on Japanese Patent Application No. 2010-011031 which is herein incorporated by reference.

What is claimed is:

1. A method for manufacturing a semiconductor light-emitting device comprising:
    a step for forming a semiconductor film on top of a growth substrate;
    a step for etching said semiconductor film along element dividing lines to form dividing grooves in said semiconductor film reaching the growth substrate and dividing said semiconductor film;
    a step for filling said dividing grooves with a resin having laser absorbing properties;
    a step for forming on top of said semiconductor film a support member for supporting said semiconductor film; and
    a step for directing a laser at said growth substrate from a rear surface, breaking down said semiconductor film and said resin near an interface with said growth substrate, and delaminating said growth substrate from said semiconductor film,
    wherein
    said laser directing step further comprises a first laser exposure step for performing laser exposure at an energy density at which the resin is broken down but said semiconductor film is not broken down, in a range including a portion adjacent to at least one section of said semiconductor film divided by said dividing grooves and said at least one section of said resin, and a second exposure step for performing laser exposure at an energy density at which said semiconductor film can be broken down in a range including said at least one section.

2. The manufacturing method of claim 1, wherein a space is formed on an outer periphery of said at least one section in the first laser exposure step.

3. The manufacturing method of claim 1, wherein said laser exposure range in said second laser exposure step is narrower than said laser exposure range in said first laser exposure range.

4. The manufacturing method of claim 1, wherein said laser exposure range in said first laser exposure step reaches a center position in the lateral direction of the element-dividing groove surrounding said at least one section.

5. The method for manufacturing semiconductor light-emitting device according to claim 1, wherein said support-member-forming step includes a step for forming a plating film on top of said semiconductor film.

6. The method for manufacturing semiconductor light-emitting device of claim 1, wherein said support-member-forming step includes a step for joining a support substrate to a front surface of said semiconductor film, a joining layer being interposed therebetween.

7. The manufacturing method according to claim 1, said support-member-forming step includes a step for joining individual sections of said semiconductor film on top of a support substrate in a flip-chip connection configuration.

8. The manufacturing method of claim 2, wherein said laser exposure range in said second laser exposure step is narrower than said laser exposure range in said first laser exposure range.

9. The manufacturing method of claim 2, wherein said laser exposure range in said first laser exposure step reaches a center position in the lateral direction of the element-dividing groove surrounding said at least one section.

10. The method for manufacturing semiconductor light-emitting device according to claim 2, wherein said support-member-forming step includes a step for forming a plating film on top of said semiconductor film.

11. The method for manufacturing semiconductor light-emitting device of claim 2, wherein said support-member-forming step includes a step for joining a support substrate to a front surface of said semiconductor film, a joining layer being interposed therebetween.

12. The manufacturing method according to claim 2, said support-member-forming step includes a step for joining individual sections of said semiconductor film on top of a support substrate in a flip-chip connection configuration.

13. The manufacturing method of claim 3, wherein said laser exposure range in said first laser exposure step reaches a center position in the lateral direction of the element-dividing groove surrounding said at least one section.

14. The method for manufacturing semiconductor light-emitting device according to claim 3, wherein said support-member-forming step includes a step for forming a plating film on top of said semiconductor film.

15. The method for manufacturing semiconductor light-emitting device of claim 3, wherein said support-member-forming step includes a step for joining a support substrate to a front surface of said semiconductor film, a joining layer being interposed therebetween.

16. The manufacturing method according to claim 3, said support-member-forming step includes a step for joining individual sections of said semiconductor film on top of a support substrate in a flip-chip connection configuration.

17. The method for manufacturing semiconductor light-emitting device according to claim 4, wherein said support-member-forming step includes a step for forming a plating film on top of said semiconductor film.

18. The method for manufacturing semiconductor light-emitting device of claim 4, wherein said support-member-forming step includes a step for joining a support substrate to a front surface of said semiconductor film, a joining layer being interposed therebetween.

19. The manufacturing method according to claim 4, said support-member-forming step includes a step for joining individual sections of said semiconductor film on top of a support substrate in a flip-chip connection configuration.

* * * * *